United States Patent [19]

Hiraki

[11] Patent Number: 5,628,058
[45] Date of Patent: May 6, 1997

[54] TRANSCEIVER CIRCUIT MODULE HAVING ELECTROMAGNETICALLY-ISOLATED TRANSMITTING AND RECEIVING CIRCUIT SECTIONS

[75] Inventor: Tetsuro Hiraki, Shiga, Japan

[73] Assignee: NEC Corporation, Tokyo, Japan

[21] Appl. No.: 275,356

[22] Filed: Jul. 15, 1994

[30] Foreign Application Priority Data

Jul. 16, 1993 [JP] Japan .................................. 5-199279

[51] Int. Cl.⁶ ............................................... H04B 1/40
[52] U.S. Cl. ........................... 455/90; 455/300; 455/349; 361/800; 361/818
[58] Field of Search ................... 455/78, 86, 90, 455/128, 300, 301, 347, 348, 349, 351; 361/679, 736, 739, 814, 816, 799, 800, 801, 818

[56] References Cited

U.S. PATENT DOCUMENTS

| | | |
|---|---|---|
| 5,107,404 | 4/1992 | Tam ................................ 455/348 X |
| 5,150,282 | 9/1992 | Tomura . |
| 5,239,689 | 8/1993 | Fukuda ................................ 455/86 |
| 5,375,256 | 12/1994 | Yokoyama et al. ................... 455/90 X |
| 5,428,824 | 6/1995 | Kasai ................................ 455/78 |

FOREIGN PATENT DOCUMENTS

| | | |
|---|---|---|
| 0169329 | 1/1986 | European Pat. Off. . |
| 0394053 | 10/1990 | European Pat. Off. . |
| 0504020 | 9/1992 | European Pat. Off. . |
| 0524460 | 1/1993 | European Pat. Off. . |

*Primary Examiner*—Reinhard J. Eisenzopf
*Assistant Examiner*—Philip J. Sobutka
*Attorney, Agent, or Firm*—Popham, Haik Schnobrich & Kaufman, Ltd.

[57] ABSTRACT

In a transceiver circuit module, a transmitting circuit section and a receiving circuit section are located on a board, and the transmitting circuit section and the receiving circuit section are electromagnetically isolated from each other by an electromagnetic shield wall.

17 Claims, 3 Drawing Sheets

TRANSCEIVER CIRCUIT MODULE HAVING ELECTROMAGNETICALLY-ISOLATED TRANSMITTING AND RECEIVING CIRCUIT SECTIONS

BACKGROUND OF THE INVENTION

1. Field of the Invention

The present invention relates to a transceiver circuit module for use in both transmission and reception in a radio communication apparatus.

2. Description of the Related Art

In the United States and Europe, a cordless telephone system carries out communication using a high frequency of 900 MHz between a host phone set and child phone sets (cordless extensions). Also, in Japan, the high frequency of 900 MHz is used for portable telephones.

A prior art transceiver circuit module used in the above-mentioned communication system is comprised of a transmitting circuit section and a receiving circuit section mounted on a board. In the prior art transceiver circuit module, however, the transmitting circuit section and the receiving circuit section are not clearly isolated from each other. As a result, interference from high frequency signals may occur between the transmitting circuit section and the receiving circuit section, which creates noise therein. Also, circuits in the transmitting circuit section and the receiving circuit section are located on the board without consideration of a stream of signals thereof, so that ground connections connected to the circuits may not be short enough, thus destabilizing the operation of the circuits at high frequencies.

SUMMARY OF THE INVENTION

It is an object of the present invention to provide a transceiver circuit module capable of avoiding interference from high frequency signals between circuits.

Another object is to stabilize the operation of a transceiver circuit module at high frequencies.

According to the present invention, in a transceiver circuit module, a transmitting circuit section and a receiving circuit section are located on a board, and the transmitting circuit section and the receiving circuit section are electromagnetically isolated from each other by an electromagnetic shield wall. As a result, interference from high frequency signals between the transmitting section and the receiving section can be avoided.

Also, in the present invention, circuits of the transmitting circuit section and circuits of the receiving circuit section are arranged so that a stream direction of signals through the circuits of the transmitting circuit section with respect to the electromagnetic shield case is the same as a stream direction of signals through the circuits of the receiving circuit section with respect to the electromagnetic shield case. As a result, ground connections connected to the circuits can be shortened, to thereby stabilize the operation thereof at high frequencies.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENT

Figure 1:
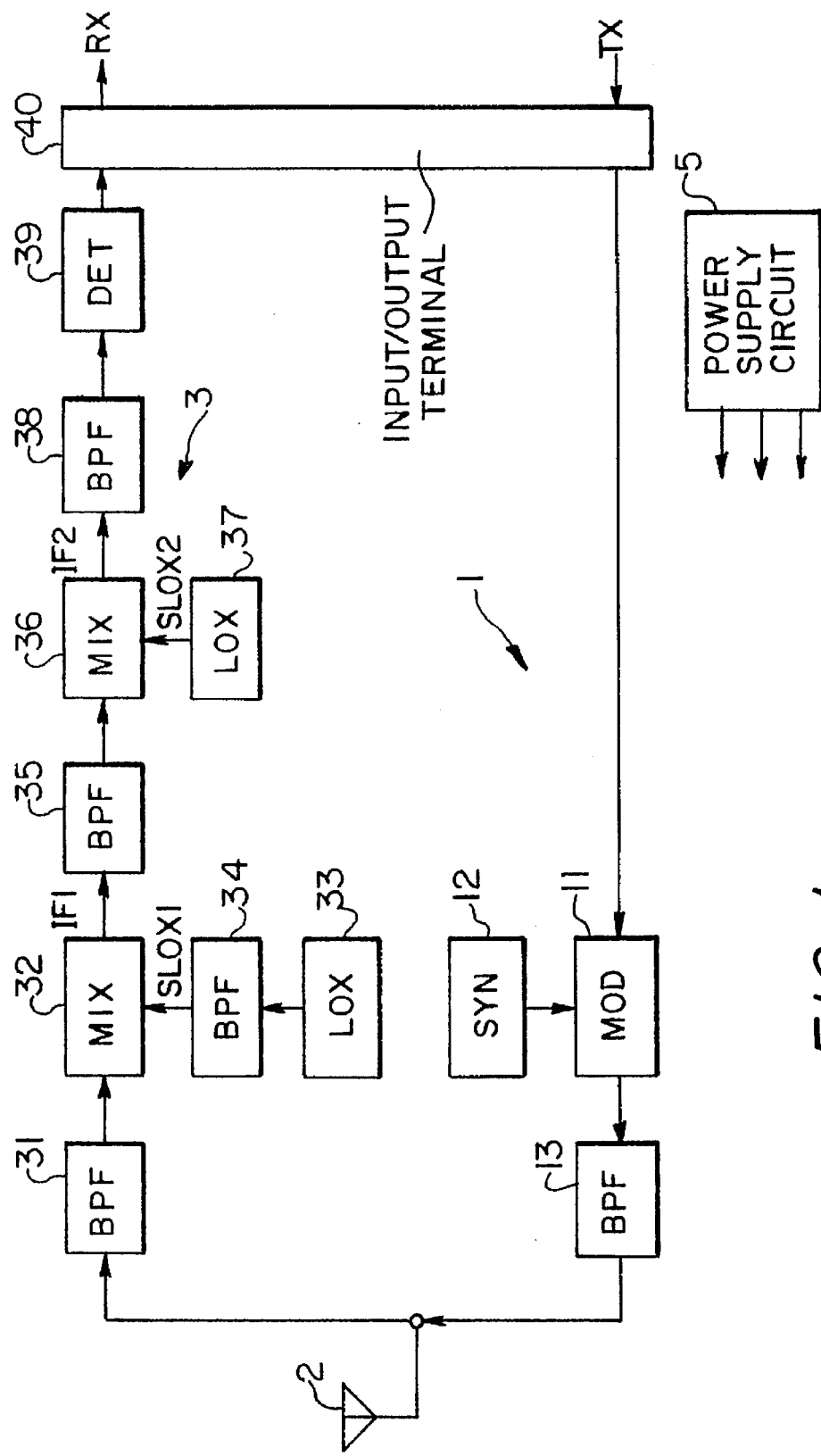
FIG. 1 is a block circuit diagram illustrating an embodiment of the transceiver circuit module according to the present invention.

In FIG. 1, reference numeral 1 designates a transmitting circuit which is comprised of a transmitting oscillation circuit 11, a synthesizer circuit 12 and a band pass filter 13. In this case, the transmitting oscillation circuit 11 receives a transmitting signal TX, and modifies it with a transmitting oscillation signal (i.e., a carrier signal) selected by the synthesizer circuit 12 to generate a high frequency transmitting signal. This high frequency transmitting signal is supplied to the band pass filter 13 which selectively passes the high frequency signal therethrough. Then, the high frequency signal is supplied to an antenna element 2 located outside of the transceiver circuit module. Also, the band pass filter 13 serves to prevent a high frequency receiving signal received by the antenna element 2 from penetrating into the transmitting circuit 1.

Reference numeral 3 designates a receiving circuit which is comprised of a band pass filter 31 for selectively receiving the receiving high frequency signal, and a mixer circuit 32 for mixing the output signal of the band pass filter 31 with a first local oscillation signal SLOX1 from a local oscillation circuit 33 via a band pass filter 34, to generate a first intermediate frequency signal IF1. The receiving circuit 3 further includes a band pass filter 35, a mixer circuit 36 for mixing the output signal of the band pass filter 35 with a second local oscillation signal SLOX2 from a local oscillation circuit 37, to generate a second intermediate frequency signal IF2, a band pass filter 38 and a detection circuit 39 for detecting the second intermediate frequency signal IF2 to extract an audio signal therefrom.

In the receiving circuit 3, the band pass filter 31 not only selectively passes the high frequency receiving signal, but also, serves to prevent the high frequency transmitting signal from the band pass filter 13 from penetrating into the receiving circuit 1. Also, the mixer circuits 32 and 36 are used for a double superheterodyne detection system. That is, in the mixer circuit 32, the frequency of the first intermediate frequency signal is always definite regardless of a receiving channel by changing the local oscillation signal SLOX1 of the local oscillation circuit 33, and in the mixer circuit 36, the second intermediate frequency signal IF2 whose frequency is lower than of the first intermediate frequency signal IF1.

Note that the band pass filter 35 selectively passes the first intermediate frequency signal IF1 therethrough, and the band pass filter 38 selectively passes the first intermediate frequency signal IF2 therethrough.

The audio signal of the detection circuit 39 is supplied to an input/output terminal 40 which transmits it as a receiving signal RX to an external circuit (not shown). On the other hand, the input/output terminal 40 receives the transmitting signal TX from the external circuit and transmits it to the transmitting oscillation circuit 11.

Also, reference numeral 5 designates a power supply circuit for supplying power to each circuit within the transceiver circuit module.

Figure 2:
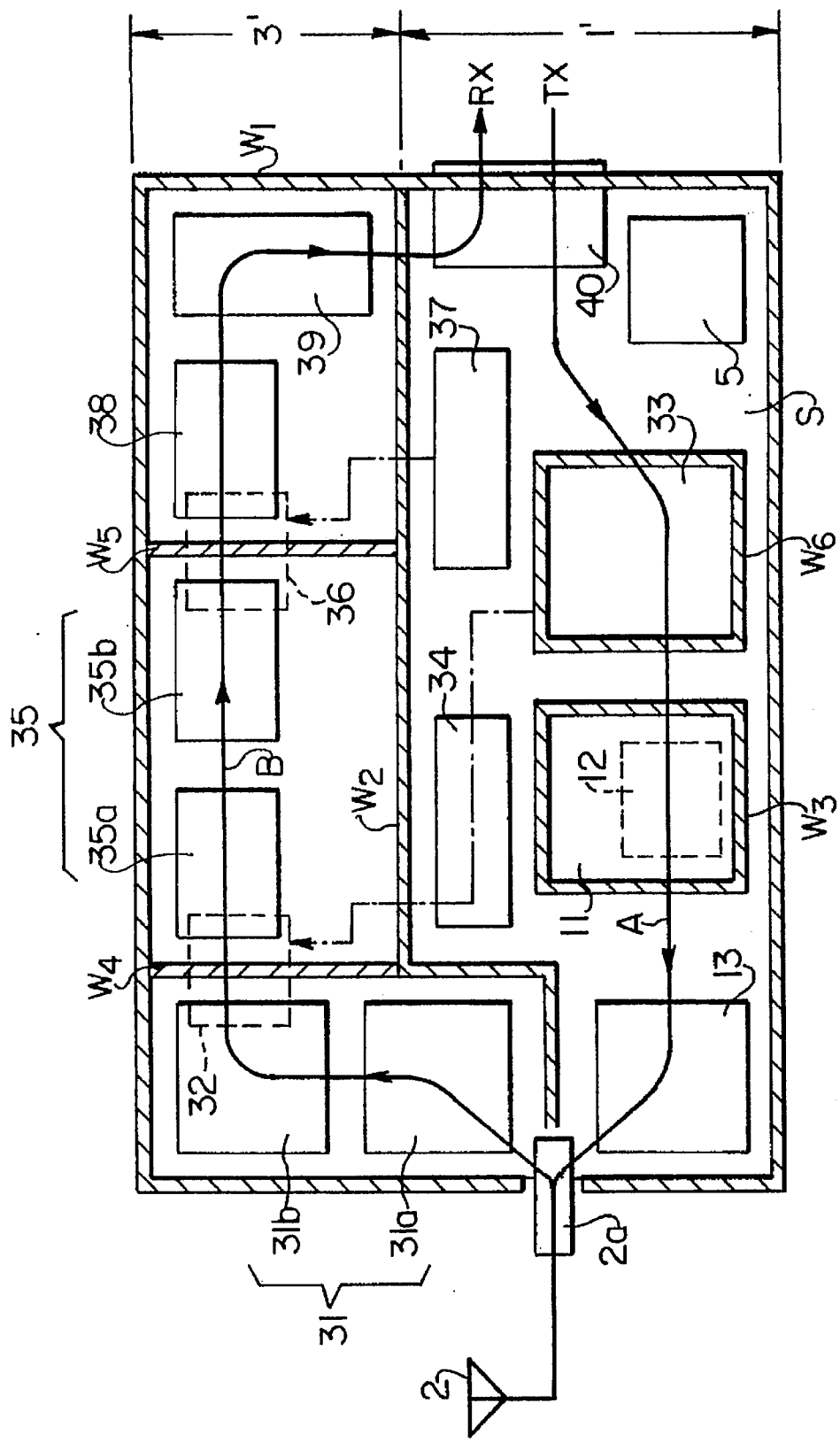
FIG. 2 is a plan view of the transceiver circuit module of FIG. 1.
Figure 3:
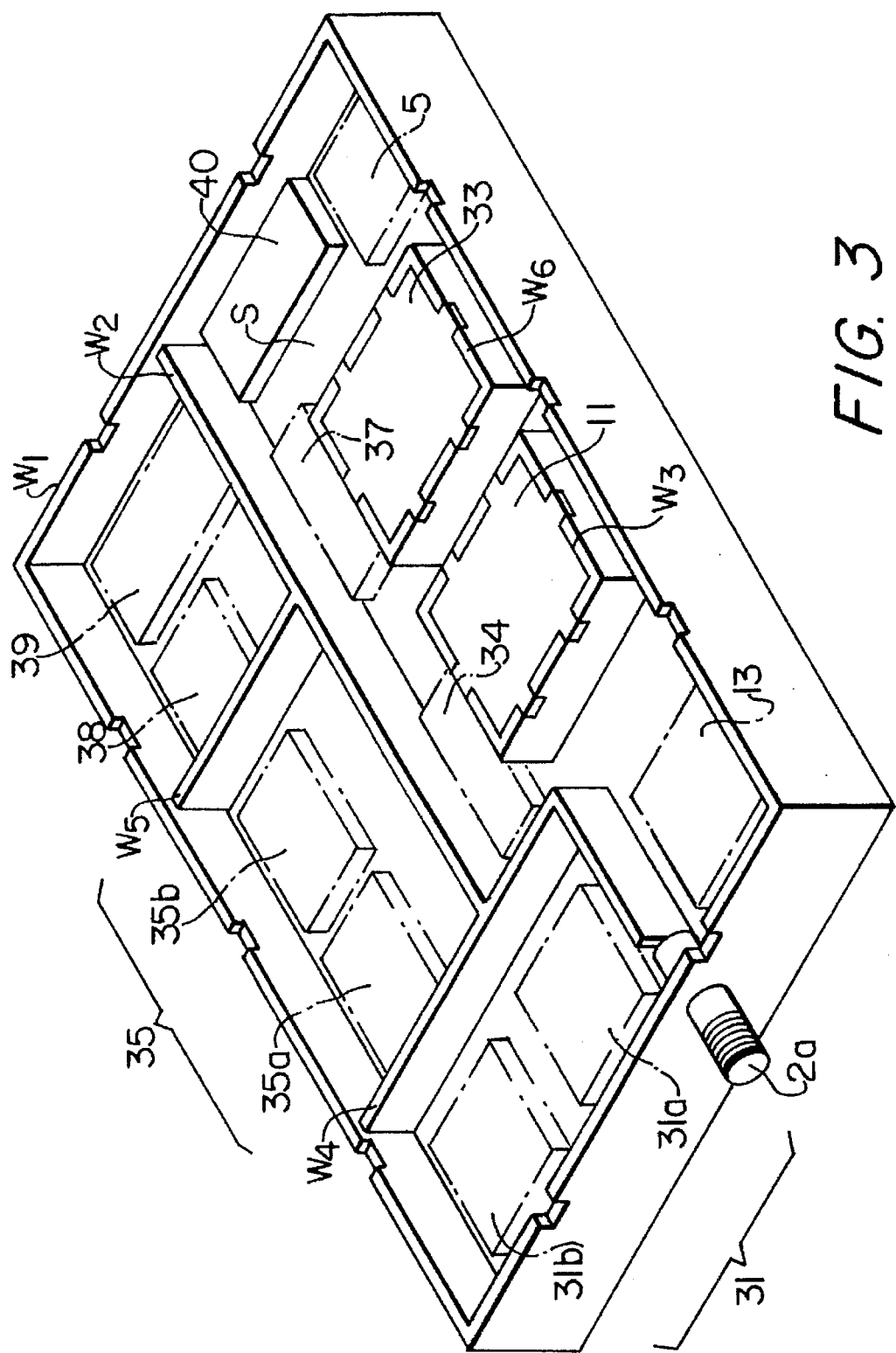
FIG. 3 is a perspective view of the transceiver circuit module of FIG. 1.

As illustrated in FIGS. 2 and 3, all of the circuits of the transceiver circuit module of FIG. 1 are mounted on a board S whose outer circumference is covered by an electromagnetic shield case $W_1$.

Provided on the electromagnetic shield case $W_1$ at an end of the board S is an antenna plug terminal $2a$ for connecting the antenna element 2 thereto. Also, provided at the other end of the board S is the input/output terminal 40.

An electromagnetic shield wall $W_2$ is provided at an approximately center portion of the board S from the antenna plug terminal $2a$ to the input/output terminal 40, to divide the area of the board S into a transmitting circuit section 1' and a receiving circuit section 3'. In this case, the input/output terminal 40 is arranged within the transmitting circuit section 1' in consideration of a circuit arrangement balance.

The transmitting oscillation circuit 11 and the band pass filter 13 are arranged in this order from the input/output terminal 40 to the antenna plug terminal $2a$ on a surface of the board S within the transmitting circuit section 1'. The synthesizer circuit 12 is arranged on a back face of the board S opposing the transmitting oscillation circuit 11. As a result, the transmitting signal TX passes from the input/output terminal 40 via the transmitting oscillation circuit 11 and the band pass filter 13 to the antenna plug terminal $2a$ as indicated by a stream A in FIG. 2.

Also, an electromagnetic shield wall $W_3$ is provided on the surface of the board S to surround the transmitting oscillation circuit 11, thus electromagnetically isolating the transmitting oscillation circuit 11 whose oscillation frequency is high.

The band pass filter 31 formed by two band pass filters $31a$ and $31b$, the band pass filter 35 formed by two band pass filters $35a$ and $35b$, the band pass filter 38, and the detection circuit 39 are arranged in this order on the surface of the board S within the receiving circuit section 3'. Also, the mixer circuit 32 is arranged on the back face of the board S between the band pass filters 31 and 35, and the mixer circuit 36 is arranged on the back face of the board S between the band pass filters 35 and 36. As a result, the receiving signal RX passes from the antenna plug terminal $2a$ via the band pass filter 31, the mixer circuit 32, the band pass filter 35, the mixer circuit 36, the band pass filter 38, and the detection circuit 39 to the input/output terminal 40 as indicated by a stream B in FIG. 2.

Note that each of the band pass filters 31 and 35 requires a relatively large attenuation factor such as about 70 dB. Therefore, the band pass filter 31 is composed of the two-stage band pass filters $31a$ and $31b$ each having a relative small attenuation factor such as about 35 dB, and the band pass filter 35 is composed of the two-stage band pass filters $35a$ and $35b$ each having a relative small attenuation factor such as about 35 dB.

Further, an electromagnetic shield wall $W_4$ is provided on the surface of the board S between the band pass filters 31 and 35, to thereby electromagnetically isolate them from each other.

Also, an electromagnetic shield wall $W_5$ is provided on the surface of the board S between the band pass filters 35 and 38, to thereby electromagnetically isolate them from each other.

The local oscillation circuit 33, the band pass filter 34, and the local oscillation circuit 37 of the receiving circuit 3 are provided within the transmitting circuit section 1', not within the receiving circuit section 3', in order to equalize the areas of the transmitting circuit section 1' and the receiving circuit section 3'. Also, the local oscillation circuit 33 is electromagnetically isolated by an electromagnetic shield wall $W_6$ from the other circuits, since the oscillation frequency of the local oscillation circuit 33 is high. On the other hand, it is unnecessary to electromagnetically isolate the local oscillation circuit 37 from the other circuits, since the oscillation frequency of the local oscillation circuit 37 is low.

The power supply circuit 5 is provided on the surface of the board S within the transmitting circuit section 1', in order to equalize the areas of the transmitting circuit section 1' and the receiving circuit section 3'.

Note that the electromagnetic shield case $W_1$ and the electromagnetic shield walls $W_2$ to $W_6$ can be made of metal having a definite conductivity and a definite permeability.

In the above-described embodiment, since the path A of the transmitting signal TX and the path B of the receiving signal RX are completely electromagnetically isolated by the electromagnetic shield wall $W_2$ from each other, interference caused by high frequency signals may not occur. Also, since the circuits 11, 13, 31 ($31a$, $31b$), 32, 35 ($35a$, $35b$), 36, 38 and 39 can be arranged adjacent to the electromagnetic shield case $W_1$, ground connections of amplification elements included in the circuits can be connected to the electromagnetic shield case $W_1$, and in addition, the lengths of the ground connections can be reduced. As a result, the circuits can operate stably at high frequencies.

As explained hereinbefore, according to the present invention, interference caused by high frequency signals between a transmitting circuit and a receiving circuit can be reduced. Also, each circuit within the transmitting circuit and the receiving circuit can be operated stably at high frequencies.

I claim:

1. A transceiver circuit module, comprising:
    a) a board having a front face and a back face and having a transmitting circuit section and a receiving circuit section, wherein said transmitting circuit section includes:
        1) a transmitting oscillation circuit located on said front face for receiving a transmitting signal and for modulating a transmitting oscillation signal with the transmitting signal to generate a high frequency transmitting signal; and
        2) a first band pass filter located on said front face, connected between said transmitting oscillation circuit and an antenna plug element, for selectively passing the high frequency transmitting signal;
    b) a first electromagnetic shield wall, located on a surface of said board, for electromagnetically, isolating said transmitting circuit section from said receiving circuit section;
    c) an electromagnetic shield case located at an outer circumference of said board;
    d) the antenna plug terminal, located at said electromagnetic shield case around one end of said first electromagnetic shield wall; and
    e) a synthesizer circuit, located on said back face of said board and connected to said transmitting oscillation circuit, for generating the transmitting oscillation signal.

2. A module as set forth in claim 1, further comprising a second electromagnetic shield wall surrounding said transmitting oscillation circuit.

3. A module as set forth in claim 1, wherein said transmitting circuit section includes an input/output terminal.

4. A module as set forth in claim 1, wherein said transmitting circuit section includes a power supply circuit.

5. A module as set forth in claim 1, wherein circuits of said transmitting circuit section and circuits of said receiving circuit section are arranged so that a stream direction of signals through the circuits of said transmitting circuit section with respect to said electromagnetic shield case is opposite to a stream direction of signals through the circuits of said receiving circuit section with respect to said electromagnetic shield case.

6. A module as set forth in claim 1, wherein said receiving circuit section includes:

- a second band pass filter, connected to said antenna plug terminal, for selectively passing a receiving high frequency signal;
- a first mixer circuit, connected to said second band pass filter, for mixing the high frequency receiving signal with a first local oscillation signal to generate a first intermediate frequency signal;
- a third band pass filter, connected to said first mixer circuit, for selectively passing the first intermediate frequency signal;
- a second mixer circuit, connected to said third band pass filter, for mixing the first intermediate frequency signal with a second local oscillation signal to generate a second intermediate frequency signal;
- a fourth band pass filter, connected to said second mixer circuit, for selectively passing the second intermediate frequency signal; and
- a detection circuit, connected to said fourth band pass filter, for detecting the second intermediate frequency signal.

7. A module as set forth in claim 6, wherein said transmitting circuit section further includes a second local oscillation circuit, connected to said second mixer circuit, for generating the second local oscillation signal.

8. A module as set forth in claim 6, wherein said first and second mixer circuits are located at a back face of said board.

9. A module as set forth in claim 8, further comprising a third electromagnetic shield wall for electromagnetically isolating said second band pass filter from said third band pass filter.

10. A module as set forth in claim 8, further comprising a fourth electromagnetic shield wall for electromagnetically isolating said third band pass filter from said fourth band filter.

11. A module as set forth in claim 6, wherein said first and second mixer circuits are located on a back face of said board.

12. A module as set forth in claim 6, wherein said transmitting circuit section further includes a first local oscillation circuit, connected to said first mixer circuit, for generating the first local oscillation signal.

13. A module as set forth in claim 12, wherein said transmitting circuit section further includes a fifth band pass filter, connected between said first local oscillation circuit and said first mixer circuit, for selectively passing the first local oscillation signal.

14. A module as set forth in claim 12, further comprising a fifth electromagnetic shield wall surrounding said first local oscillation circuit.

15. A transceiver circuit module, comprising:

a) a board having a front face and a back face and having a transmitting circuit section and a receiving circuit section, wherein said receiving circuit section includes:
  1) a first band pass filter located on said front face for selectively passing a receiving high frequency signal;
  2) a first mixer circuit, located at said back face of said board and connected to said first band pass filter, for mixing the high frequency receiving signal with a first local oscillation signal to generate a first intermediate frequency signal;
  3) a second band pass filter located on said front face, connected to said first mixer circuit, for selectively passing the first intermediate frequency signal;
  4) a second mixer circuit, located at said back face of said board and connected to said second band pass filter, for mixing the first intermediate frequency signal with a second local oscillation signal to generate a second intermediate frequency signal;
  5) a third band pass filter located on said front face, connected to said second mixer circuit, for selectively passing the second intermediate frequency signal; and
  6) a detection circuit located on said front face, connected to said third band pass filter, for detecting the second intermediate frequency signal; and b) a first electromagnetic shield wall, located on a surface of said board, for electromagnetically isolating said transmitting circuit section from said receiving circuit section.

16. The module of claim 15, further comprising:

a second electromagnetic shield wall for electromagnetically isolating said first band pass filter from said second band pass filter.

17. The module of claim 15, further comprising:

a third electromagnetic shield wall for electromagnetically isolating said second band pass filter from said third band pass filter.

\* \* \* \* \*